United States Patent
Ho et al.

(10) Patent No.: US 8,077,513 B2
(45) Date of Patent: Dec. 13, 2011

(54) METHOD AND APPARATUS FOR PROGRAMMING A MULTI-LEVEL MEMORY

(75) Inventors: Hsin-Yi Ho, Hsinchu (TW); Chia-Ching Li, Lujhou (TW); Chun-Hsiung Hung, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 2 days.

(21) Appl. No.: 12/566,144

(22) Filed: Sep. 24, 2009

(65) Prior Publication Data

US 2011/0069544 A1    Mar. 24, 2011

(51) Int. Cl.
*G11C 11/34* (2006.01)

(52) U.S. Cl. ......... 365/185.03; 365/185.01; 365/185.02; 365/185.11; 365/185.19; 365/185.22; 365/185.23; 365/185.24; 365/189.16; 365/189.15; 365/230.03; 365/233.16; 365/233.17

(58) Field of Classification Search ............. 365/185.01, 365/185.02, 185.03, 185.11, 185.19, 185.22, 365/185.23, 185.24, 189.16, 189.15, 230.03, 365/233.16, 233.17
See application file for complete search history.

(56) References Cited

U.S. PATENT DOCUMENTS

| | | | |
|---|---|---|---|
| 7,085,168 B2 | 8/2006 | Lee et al. | |
| 7,206,225 B2 | 4/2007 | Wu | |
| 7,397,705 B1 * | 7/2008 | Huang et al. | 365/185.28 |
| 7,471,568 B2 | 12/2008 | Wu | |
| 7,474,565 B2 | 1/2009 | Huang et al. | |
| 7,474,567 B2 | 1/2009 | Lung et al. | |
| 7,483,299 B2 | 1/2009 | Hsu et al. | |
| 2008/0137427 A1 * | 6/2008 | Huang et al. | 365/185.18 |

* cited by examiner

*Primary Examiner* — Fernando Hidalgo
(74) *Attorney, Agent, or Firm* — Alston & Bird LLP

(57) ABSTRACT

A method of programming a memory device comprising a plurality of memory cells may include verifying a first memory cell targeted to a first level with a first preliminary voltage of a first program phase (PPV1'), programming the first memory cell targeted to the first level in the first program phase, and verifying the first memory cell with a first post program-verify voltage of the first program phase (PV1') in which the first post program-verify voltage is different from the first preliminary voltage. A corresponding apparatus is also provided.

6 Claims, 7 Drawing Sheets

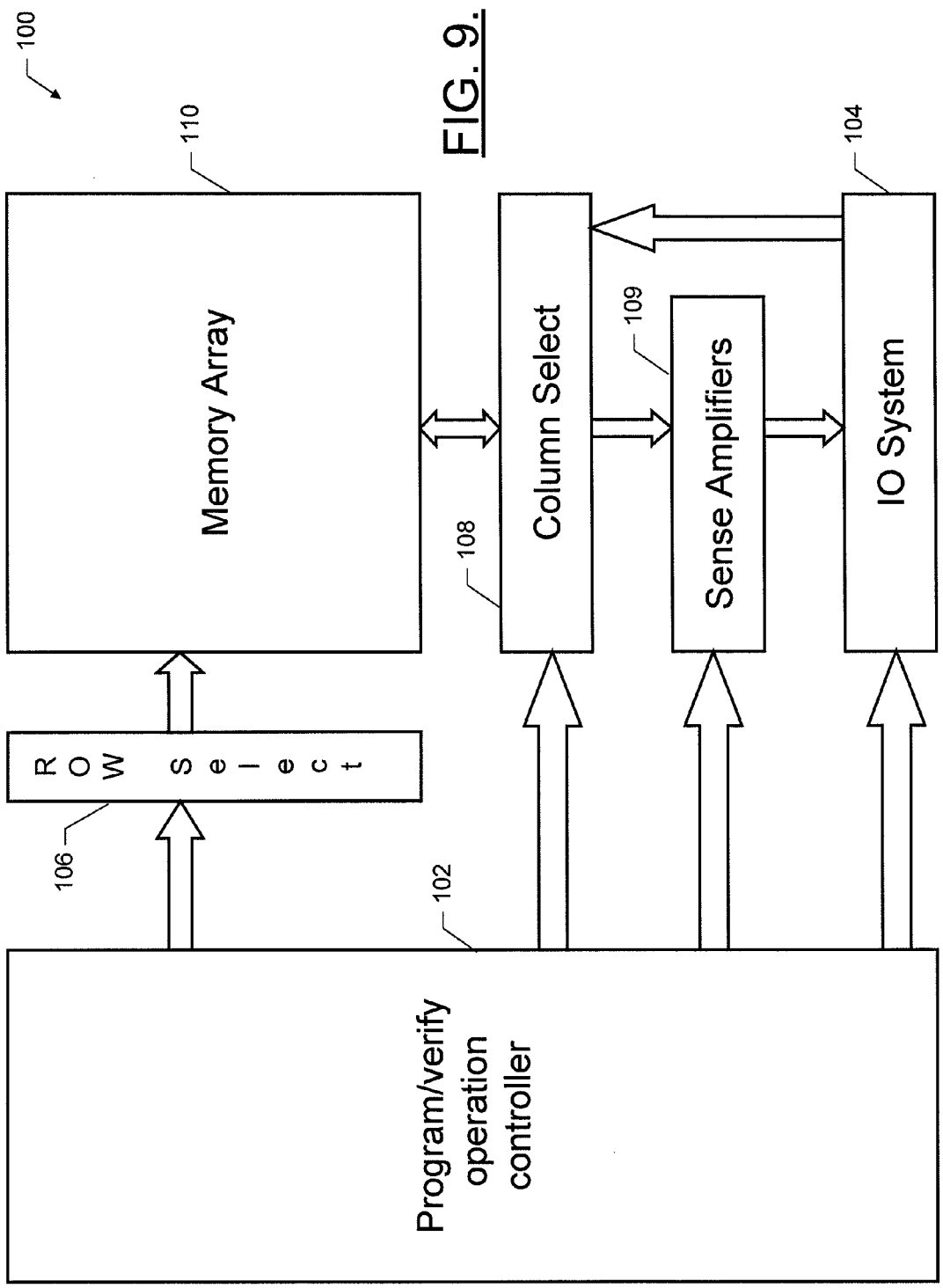

METHOD AND APPARATUS FOR PROGRAMMING A MULTI-LEVEL MEMORY

TECHNOLOGICAL FIELD

Embodiments of the present invention relate generally to non-volatile flash memory and, more particularly, relate to an apparatus and method for programming a charge-trapping memory cell flash.

BACKGROUND

Conventional flash memory cells store a charge on a floating gate that may, for example, be doped polysilicon. The stored charge changes a threshold voltage (Vt) of the memory cell. In a "read" operation, a read voltage is applied to the gate of the memory cell, and the corresponding indication of whether the memory cell turns on (e.g., conducts current) indicates the programming state of the memory cell. For example, a memory cell that conducts current during the "read" operation may be assigned a digital value of "1," and a memory cell that does not conduct current during the "read" operation may have a digital value of "0" assigned. Charge may be added to and removed from the floating gate to program and erase the memory cell (e.g., to change the memory cell value from "1" to "0").

Another type of memory uses a charge-trapping structure rather than a conductive gate material used in floating gate devices. When a charge-trapping layer is programmed, the charge may be trapped so that it does not move through the non-conductive layer. The charge may therefore be retained by the charge-trapping layer until the memory cell is erased, thereby retaining the data state without requiring a continuous source of electrical power to be applied. These charge-trapping cells can be operated as two-sided cells. In other words, because the charge does not move through the non-conductive charge trapping layer, charge can be localized on different charge-trapping sites. Thus, a so called multi-bit cell (MBC) may be created, which can increase the amount of data that can be stored in a memory device without consuming more space.

FIG. 1 illustrates an example of a charge trapping memory cell 10. As shown in FIG. 1, the charge trapping memory cell 10 may include a gate 14 and symmetrical source/drain regions (e.g., S/D regions 16 and 18) that are in communication with a semiconductor channel 20. The semiconductor channel 20 and the gate 14 may be separated from a charge trapping layer 12 by insulation layers (e.g., oxide regions 13 and 15), respectively. In this example configuration, the left storage side 22 of the charge trapping layer 12 may be programmed to multi-level storage side and the right storage side 24 of the charge trapping layer 12 may be programmed to multi-level storage side.

The illustrated left storage side 22 and right storage side 24 may be programmed to four states (i.e., including states 00, 01, 10 and 11) and store two bits data. Since accumulation of charge is an important feature of multi-bit programming, with more precise charge placement in the charge trapping layer 12, higher numbers of bits and states may be accurately achieved. A particular bit can typically be programmed, for example, by applying a potential to the gate 14 with one of the S/D regions 16 and 18 (e.g., region 18) acting as a drain and the other of the S/D regions 16 and 18 (e.g., region 20) acting as the source. The accumulation of charge at the particular side alters the threshold voltage of the left storage side 22 or right storage side 24. For example, to read the value 01 (also referred to as Level 1 for purposes of illustration), a potential may be applied to the cell that is between the right-most point of the Level 1 distribution and the left-most point of the Level 2 distribution. The region or window of values that the potential may have to comply with these criteria is called a "read window."

The threshold voltage of the left storage side may be increased when programming the right storage side. The increase in threshold voltage at the left storage side is shown by the dashed line in FIG. 2 and is indicative of a phenomenon known as "the second bit effect." In order to accurately program multi-bit cells, incremental stepping of the drain line (bit line) voltage is often implemented (e.g., via application of uniform pulses to the bit line). In some cases, a program pulse is followed by a read operation in order to verify the level programmed into the cell. As the desired threshold voltage is approached, the voltage step of the pulse may be decreased. However, this may still result in relatively wide programming distributions. In general, a wider distribution correlates to a smaller read window. Furthermore, as discussed above, applying a potential to the cell typically affects both bits due to the second bit effect.

When an array of cells is arranged, the drain lines (bit lines) may be connected as well as the gate lines (word lines) and source lines. When one tries to program the entire array, program disturb may impact neighboring cells due to capacitive coupling between the cells that may change the charge levels stored in the respective bits. There are numerous mechanisms that have been developed in an effort to reduce the impact of the second bit effect and program disturb. Some of these mechanisms involve the application of different voltages to the source lines, bit lines or word lines. Thus, it may be desirable to provide an improved mechanism for programming a multi-level cell.

BRIEF SUMMARY OF EXEMPLARY EMBODIMENTS

A method and apparatus are therefore provided that may enable the programming a multi-level cell array. In one example, a suitable bit line learning value is provided by enabling a Level 1 programming for a preliminary voltage to be lower than a post program-verify voltage in the Level 1 program. Accordingly, a learned bit line value is less likely to be too low and induce long program times.

In one exemplary embodiment, a method of programming a memory device comprising a plurality of memory cells is provided. The method may include verifying a first memory cell targeted to a first level with a first preliminary voltage of a first program phase (PPV1'), programming the first memory cell targeted to the first level in the first program phase, and verifying the first memory cell with a first post program-verify voltage of the first program phase (PV1') in which the first post program-verify voltage is different from the first preliminary voltage.

In another exemplary embodiment, an apparatus for programming a memory device comprising a plurality of memory cells is provided. The apparatus may include a memory array having a plurality of memory cells and a controller configured to program and verify the memory cells by executing verifying a first memory cell targeted to a first level with a first preliminary voltage of a first program phase (PPV1'), programming the first memory cell targeted to the first level in the first program phase, and verifying the first memory cell with a first post program-verify voltage of the first program phase (PV1') in which the first post program-verify voltage is different from the first preliminary voltage.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

Figure 5:
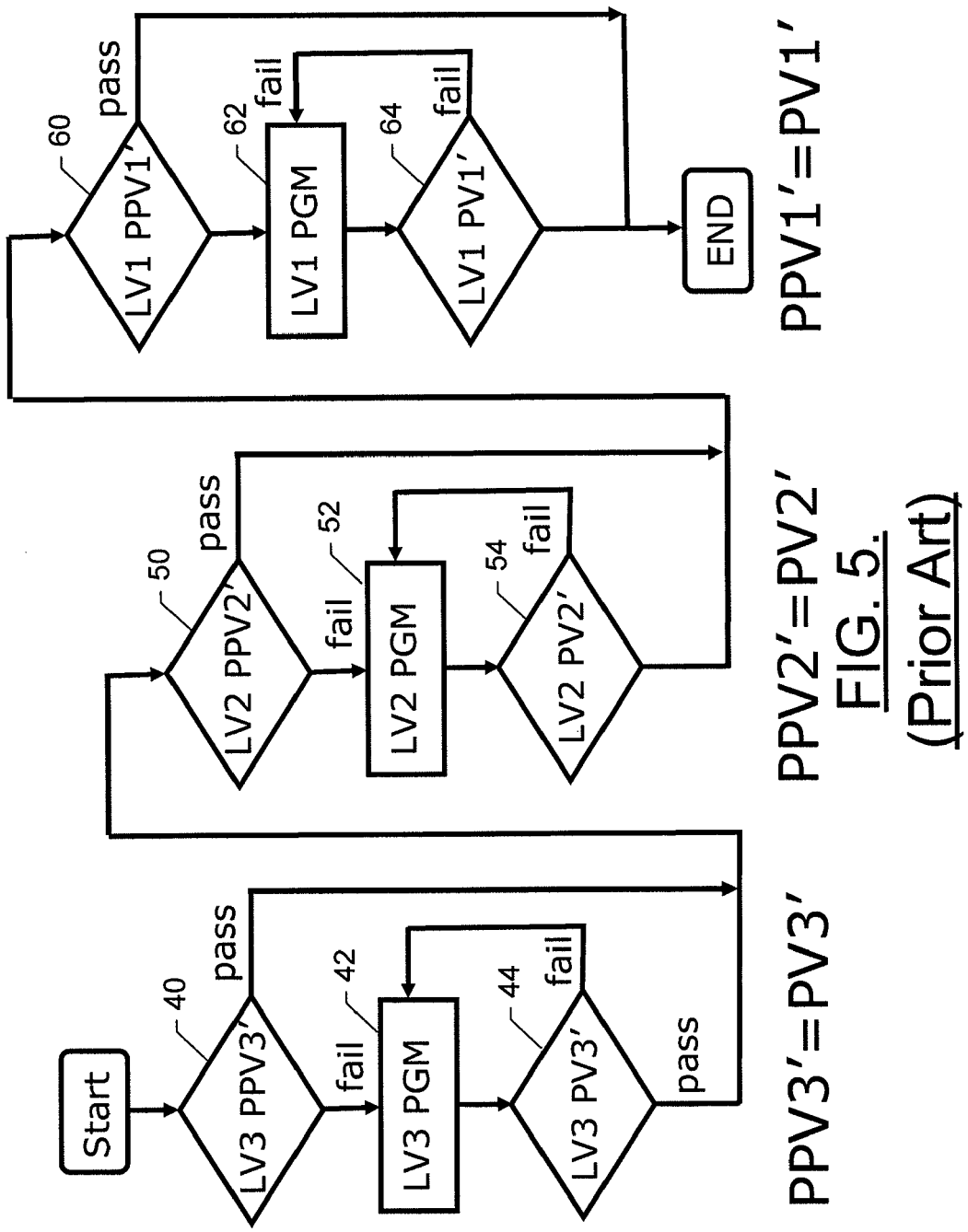
FIG. 5 illustrates an example of first phase program flow.
Figure 8:
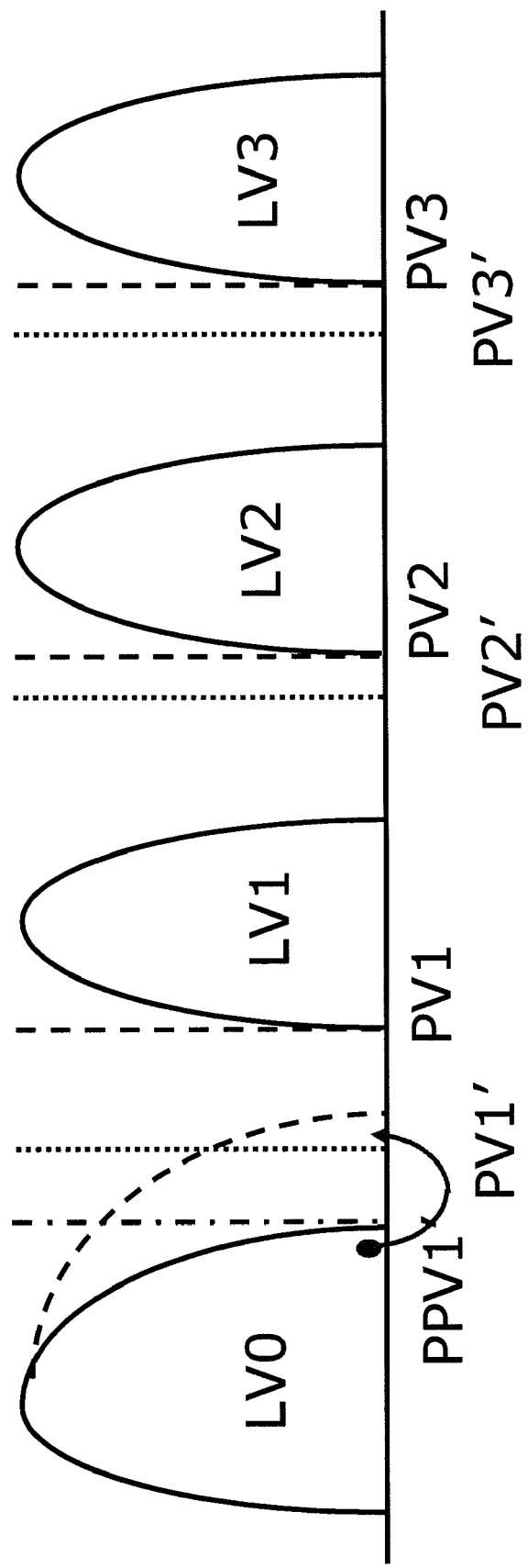

FIG. 8 illustrates a threshold voltage (Vt) distribution for a charge-trapping memory cell array upon which a post program-verify (PV) judgment can be made after first phase program flow as in the example of FIG. 5 according to an exemplary embodiment of the present invention; and FIG. 9 illustrates a schematic block diagram of an apparatus for programming a multi-level memory cell according to an exemplary embodiment of the present invention.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

Some embodiments of the present invention may provide a mechanism by which improvements may be experienced in relation to programming a charge-trapping memory cell such as, for example, a multi-level cell (MLC). In this regard, some embodiments of the present invention provide an improved method for obtaining a suitable bit line learning value to improve second phase programming and reduce program time.

Figure 3:
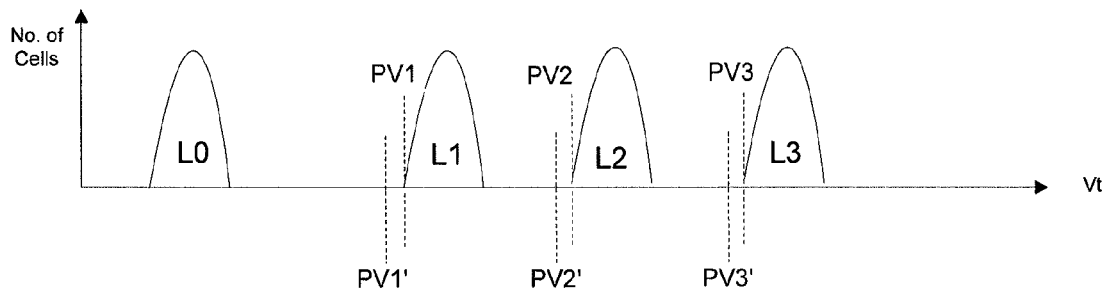
FIG. 3 illustrates memory cell distribution versus threshold voltage for a charge-trapping memory cell array.

FIG. 3 shows memory cell distribution versus threshold voltage (Vt) or "read" voltage for an charge-trapping memory cell array. Cells of the charge-trapping memory cell array may have four levels including a level corresponding to an erased condition (Level 0) and three programmed levels (Level 1, Level 2 and Level 3). The three programmed levels each have increasing amounts of charge transferred to charge-trapping sites of the cell, increasing Vt for each successive programming level. A particular site of the charge-trapping memory cell is typically programmed by programming the cell to a post program-verify voltage or value of a first program phase (e.g., PV1' for Level 1, PV2' for Level 2 and PV3' for Level 3) using a first programming technique, and then programming the cell to a post program-verify voltage or value of a second program phase (e.g., PV1 for Level 1, PV2 for Level 2 and PV3 for Level 3) using a second programming technique. The post program-verify voltage of the first program phase therefore verifies operation after the first programming operation and the post program-verify voltage of the second program phase therefore verifies operation after the second programming operation. The second programming technique typically provides more precise control of the Vt levels than the first programming technique in order to provide more narrow Vt distribution and wider read windows between programmed levels.

Figure 4:
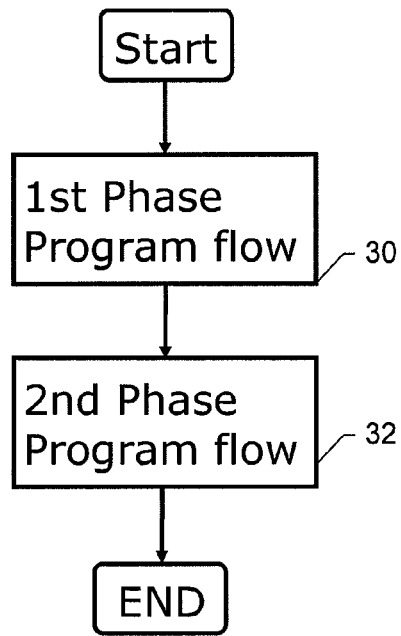
FIG. 4 illustrates a flowchart showing program flow for two phase programming of multi-bit cells.

FIG. 4 illustrates a flowchart showing program flow for two phase programming of N-bit cells according to an exemplary embodiment. As described above in relation to the description of FIG. 3, there may be a two phase program flow with programming for each of the levels being accomplished in each phase. For example, Level 3, Level 2 and Level 1 programming may be provided in each phase. In this regard, first phase program flow 30 may include Level 3, Level 2 and Level 1 programming with the post program-verify voltage of the first program phase (PV'). The second phase program flow 32 may include Level 3, Level 2 and Level 1 programming with the post program-verify voltage of the second program phase (PV). The second phase program flow 32 may program the bit line used from the first phase program flow 30 by a bit line learning method. The use of a two phase program flow may reduce the array effect to provide the narrower Vt distribution in an multi-bit cell array structure as described above in relation to the description of FIG. 3. Thus, the post program-verify voltage of the first program phase (PV') may be equal to the post program-verify voltage of the second program phase (PV) minus some change in voltage ($\Delta V$). In other words, $PV'=PV-\Delta V$ so that the program-verify level used in the second phase may provide more precise control over the Vt levels, and the program bit line value used in the second phase may be based on a bit line learning value from the first phase. Accordingly, for any particular level, the PV' of the first phase is typically lower than the PV of the second phase. In an exemplary embodiment, the program bit line value may be recorded when one bit passed in the first phase program and may be applied to the same word line in order to do second phase program flow 32.

In an effort to minimize the impact of program disturb and the second bit effect, one mechanism that has been employed is to program higher levels before lower levels. Thus, for example, in both the first phase program flow 30 and the second phase program flow 32, Level 3 programming may be accomplished first. Level 2 programming may then be accomplished, followed by Level 1 programming.

Figure 6:
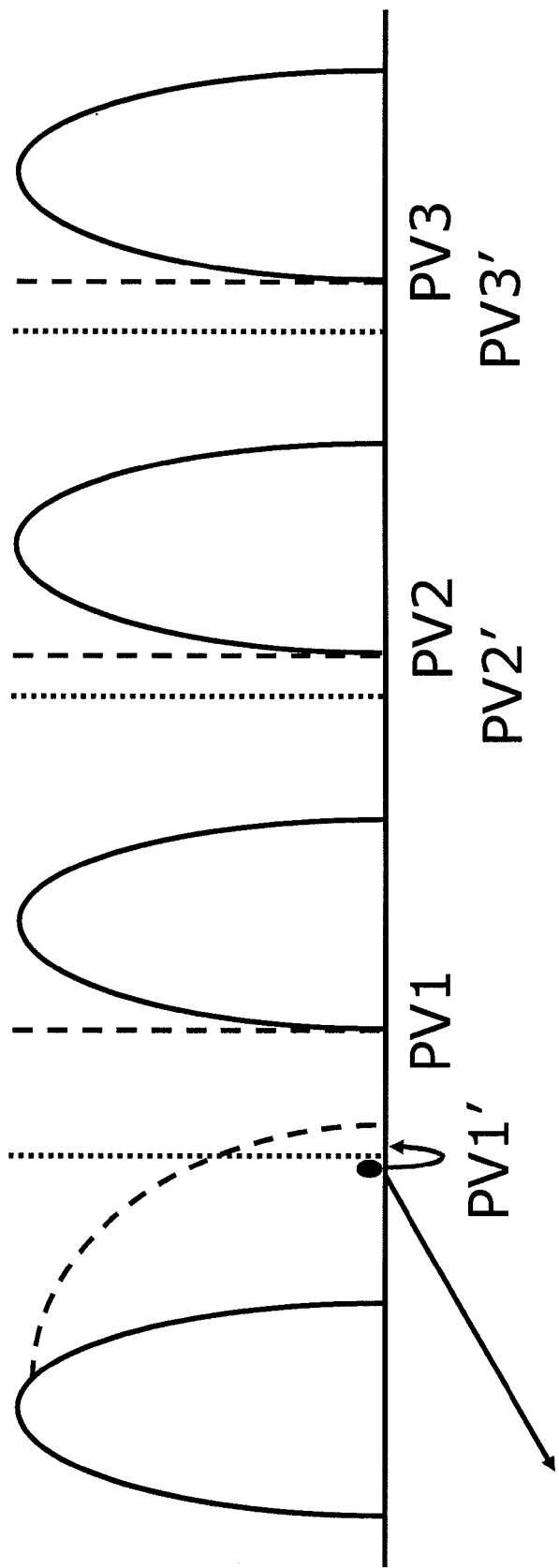
FIG. 6 illustrates a threshold voltage (Vt) distribution for a charge-trapping memory cell array upon which a post program-verify (PV) judgment can be made after first phase program flow as in the example of FIG. 5.

FIG. 5 illustrates a more detailed example of first phase program flow. FIG. 6 illustrates a Vt distribution for an charge-trapping memory cell array upon which a post program-verify (PV) judgment can be made after first phase program flow according to the example of FIG. 5. During first phase program flow an initial determination may be made at operation 40 as to whether a Level 3 preliminary verify voltage or value (PPV3') passes. In other words, an initial determination may be made as to whether a current state or level of the cell is within a given tolerance of the value expected for the cell based on the level to be programmed to the cell for the current phase. If operation 40 results in a pass, a determination may be made at operation 50 as to whether the Level 2 initial preliminary verify voltage (PPV2') passes. If operation 50 results in a pass, a determination may be made at operation 60 as to whether the Level 1 preliminary verify voltage (PPV1') passes and, if so, the first phase program flow may end and programming may proceed to second phase program flow. In the method of FIG. 5, the preliminary verify voltages PPV' (i.e., verifying operations before the programming operation) may be equivalent to their corresponding post program-verify voltages PV' of the first program phase (i.e., PPV3'=PV3'; PPV2'=PV2'; PPV1'=PV1'). In some examples, by checking to determine whether the preliminary verify voltage (PPV') for a given cell at a particular level passes, a determination may be made as to whether programming is to be done to the corresponding level for the cell. By screening in this manner, program time may be saved in some instances where the preliminary verify voltage (PPV') is already equal to the corresponding post program-verify voltage of the first program phase (PV') for that level. Notably, as used herein, the terms "equal" or "equivalent" should be understood to apply to values that are substantially or nearly equal and not necessarily require exact equivalence.

If operation 40 does not result in a pass, Level 3 programming may be accomplished at operation 42 to the Level 3 post program-verify voltage (PV3') and a determination may be made at operation 44 as to whether the PV3' value passes. Similarly, if operation 50 does not result in a pass, Level 2 programming may be accomplished at operation 52 to the Level 2 post program-verify voltage of the first program phase (PV2') and a determination may be made at operation 54 as to whether the PV2' value passes. If operation 60 does not result in a pass, Level 1 programming may be accomplished at operation 62 to the Level 1 post program-verify voltage of the first program phase (PV1') and a determination may be made at operation 64 as to whether the PV1' value passes. As a result of the programming phase of the example of FIG. 5, a charge-trapping memory cell Vt distribution for PV judgment as shown in the example of FIG. 6 may be accomplished.

As shown in FIG. 6, bit A may be judged as a non-passing bit in pre-PV (first phase program flow) (based on Vt overshoot). For example, the PV1' may be too low to overlap with the Level 0 Vt distribution of a site suffering a serious second bit effect. Thus, some Level 0 bits with a Vt higher than PV1' may become PV-pass bits even before the application of any effective program pulse. The bit line learning algorithm may therefore misjudge the first pass PV1 bit and record a lower bit line value than expected in the Level 1 program. According to the example of FIG. 6, bit A may be judged as a passing bit in post-PV (first phase program flow) due to small instabilities associated with sensing. Due to the small instability in sensing, the wrong learning may be induced and may thereafter be applied in second phase program flow. Accordingly, an initial value or the lowest bit line value may be learned in Level 1 programming if the PPV1' is equal to PV1'.

Due to the sensing variations that typically exist between pre-PV (first phase program flow) and post-PV (first phase program flow), there may be some bits that are judged as non-pass bits in pre-PV and pass bits in post-PV thereby resulting in a bit line learning algorithm learning a lower value than expected. In some cases, the lower learned bit line value is too low to apply in the second phase program flow and programming time may be increased. Embodiments of the present invention may address the issue illustrated in FIG. 6 by inserting a modification to the pre-PV flow before programming in order to screen out any already passed bits that could induce improper learning. As such, a suitable bit line learning value may be acquired based on inserting modified pre-PV flow and using a lower value for PPV1' than PV1' in the Level 1 program of the example of FIG. 5.

Figure 7:
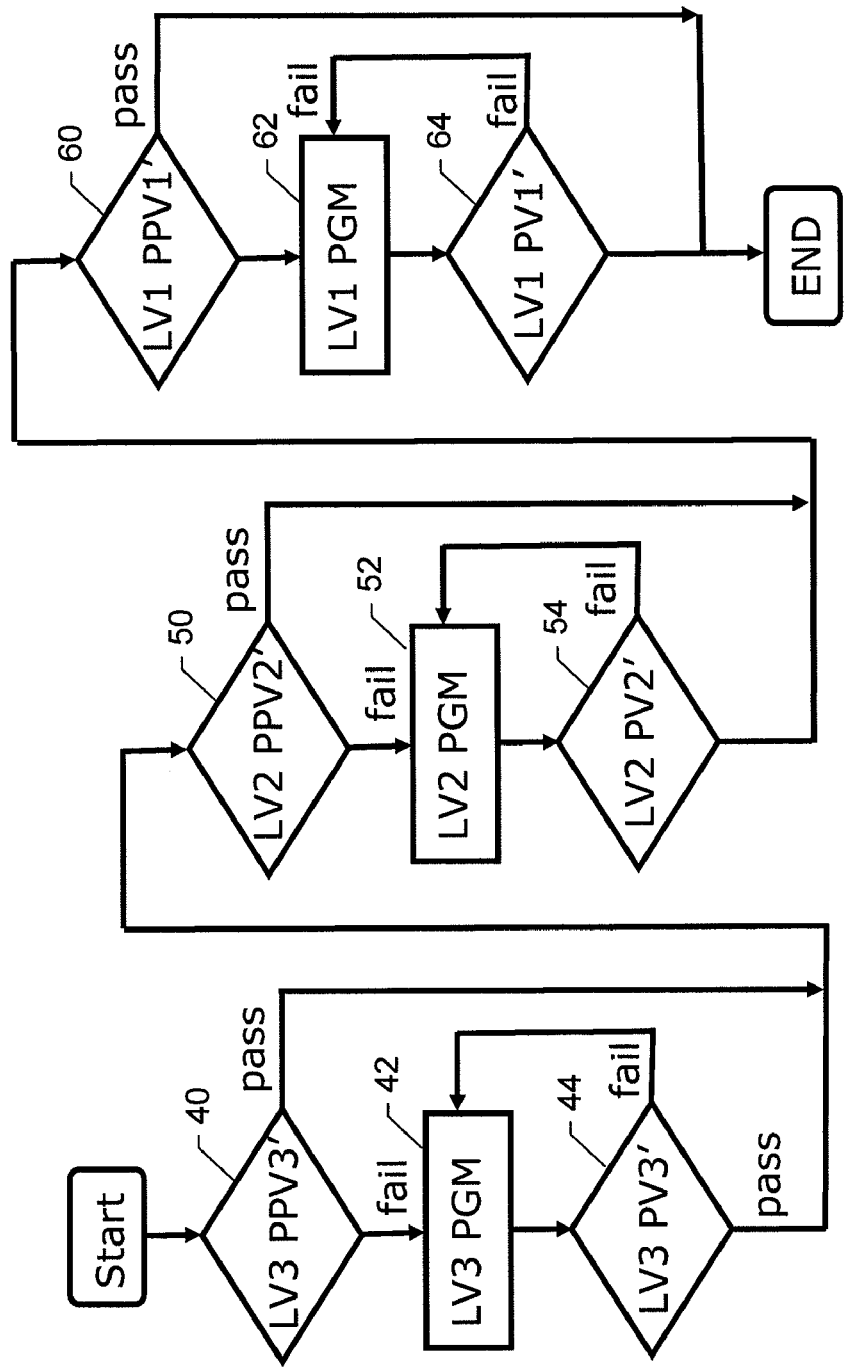
FIG. 7 illustrates an example of first phase program flow according to an exemplary embodiment of the present invention.

FIG. 7 illustrates an example of first phase program flow according to an exemplary embodiment of the present invention. In other words, FIG. 7 provides an example of a detailed description of operation 30 of FIG. 4 according to an exemplary embodiment. As shown in FIG. 7, instead of providing that PPV1' is equal to PV1', embodiments of the present invention provide for a different PPV1' value than the PV1' value in the Level 1 program. By providing for PPV1'=PV1'−ΔV, embodiments of the present invention may provide a suitable bit line learning value to improve programmability in the second phase program flow, which may result in reduced programming times. In other words, by screening to determine whether PPV' for each cell passes, some program time can typically be saved, but given the potential problem that may occur as shown in FIG. 6, some embodiments of the present invention introduce a margin between PPV' and PV' at least with respect to Level 1 programming (i.e., to PPV1' and PV1') to reduce the possibility of improper implementation of a bit line learning value from phase one program flow into phase two program flow.

FIG. 7 is substantially identical to FIG. 5, except that for Level 1 programming PPV1'=PV1'−ΔV. Accordingly, operations 40' to 64' correspond to operations 40 to 64 of FIG. 5 to provide similar program flow except that PPV1' is not equal to PV1'. The results of providing that PPV1' is not equal to PV1' can be seen in the example illustrated in FIG. 8. In this regard, FIG. 8 shows a charge-trapping memory cell array Vt distribution for PV judgment when PPV1' is not equal to PV1'. In this example, if some bits pass PPV1' in the pre-PV, those bits will be recognized as pass bits and will not be programmed again. Thus, the first program attempt for reprogramming will only be applied to bits with a Vt lower than PPV1'. When a bit passes PV1' after programming, the programmed bit line may be recorded and applied in the second phase program flow. Accordingly, instabilities in sensing will be unlikely to induce incorrect learning due to the gap inserted between PPV1' and PV1'. Furthermore, program times are likely to be reduced as the ability to achieve suitable bit line values for better programming is increased.

In general terms, FIG. 7 illustrates a first phase of a process of performing a two phase programming operation for programming a multilevel cell array. In this regard, FIG. 7 illustrates a processing of screening threshold voltage values applied to program respective ones of cells of the array to different levels for correspondence to a respective preliminary verify voltage (PPV') for each level as shown by operations 40-44 for a third level (i.e., level 3), operations 50-54 for a second level (i.e., level 2) and operations 60-64 for a first level (i.e., level 1). The preliminary verify voltage for Level 3 and Level 2 cells (PPV3' and PPV2') are equal to the post program verify values of the first program phase (PV3' and PV2') for the Level 3 and Level 2 cells, respectively. However, the preliminary verify voltage for Level 1 cell (PPV1') is not equal to the post program verify voltage of the first program phase of the Level 1 cell (PV1') (i.e., PPV1'=PV1'−ΔV).

In response to a determination, at operations 40, 50 or 60, that the preliminary verify voltage (PPV') for any level is not a passing value, programming for the corresponding level for which the preliminary verify voltage (PPV') was not a passing value is conducted at operations 42, 52 or 62, respectively. After programming, the values may be rechecked as shown at operations 44, 54 or 64, respectively. Moreover, as shown in FIG. 7, the threshold voltage values for each respective level may be screened in sequence.

FIG. 9 illustrates an apparatus for performing the programming described in connection with FIGS. 7 and 8. In some embodiments, the apparatus 100 may be an integrated circuit for programming flash memory. The apparatus 100 may include a program/verify operation controller 102 for performing programming in accordance with embodiments of the present invention.

The program/verify operation controller 102 may be embodied in a number of different ways. For example, the program/verify operation controller 102 may be embodied as various processing means such as one or more instances of a processing element, a coprocessor, a controller or various other processing devices including integrated circuits such as, for example, an ASIC (application specific integrated circuit), an FPGA (field programmable gate array), a hardware accelerator, or the like. In an exemplary embodiment, the program/verify operation controller 102 may be configured to execute instructions received by the memory. As such, the program/verify operation controller 102 may represent an entity (e.g., physically embodied in circuitry) capable of performing operations according to embodiments of the present invention while configured accordingly. Thus, for example, when the program/verify operation controller 102 is embodied as an ASIC, FPGA or the like, the program/verify operation controller 102 may be specifically configured hardware for conducting the operations described herein.

In some cases, the apparatus 100 may further include a user interface and/or a communication interface (e.g., input output system 104). If included, the user interface may be configured to receive an indication of a user input at the user interface and/or to provide an audible, visual, mechanical or other output to the user.

Figure 1:
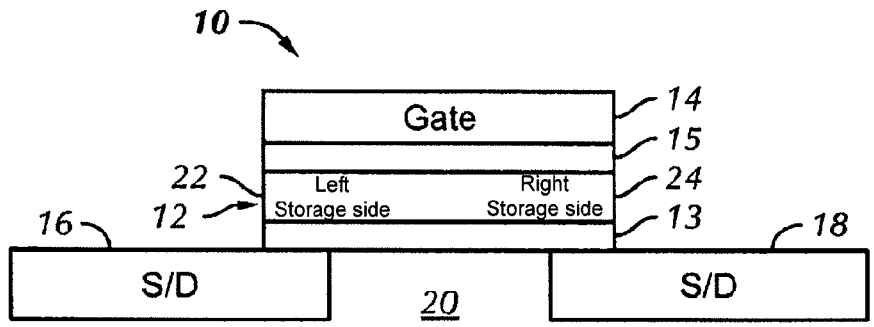
FIG. 1 illustrates an example of the components of a multi-bit cell.
Figure 2:
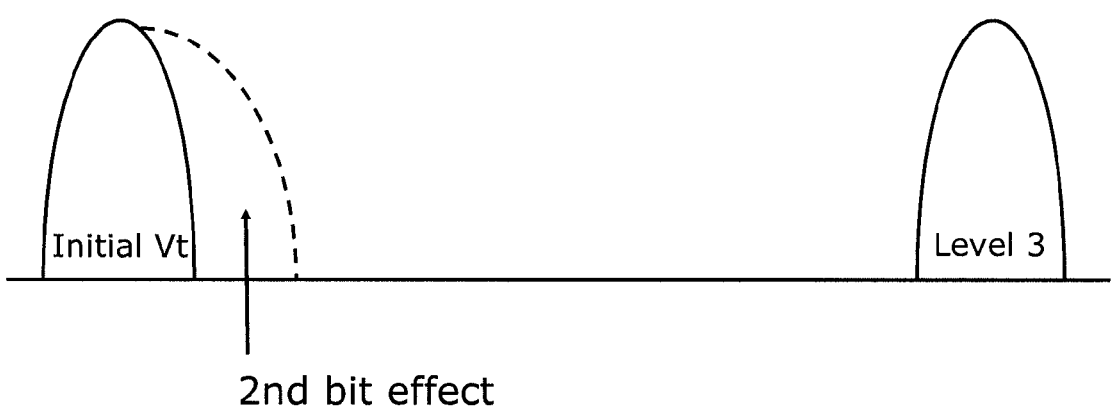
FIG. 2 illustrates exemplary programming distributions for a multi-bit cell.

The apparatus 100 may also include or be in communication with a memory array 110. The memory array 110 may include a plurality of charge-trapping memory cells (e.g., like the charge-trapping memory cell 10 of FIG. 1) in an array. The program/verify operation controller 102 may be configured to program bits of the memory array 110 to selected levels according to data received at a data input. The bits to be programmed may be selected via a row selector 106 and a column selector 108, which may be configured to select a particular row and column, respectively. In some cases, the apparatus 100 may also include one or more sense amplifiers 109 in communication with the program/verify operation controller 102, the input output system 104 and/or the column selector 108. As such, the program/verify operation controller 102 may be configured to execute functionality associated with programming according to the first phase program flow 30 of FIG. 4, where the programming is accomplished according to the parameters described in connection with the example of FIG. 7. Thereafter, the control logic may be configured to execute functionality associated with programming according to the second phase program flow 32 of FIG. 4.

In other words, the program/verify operation controller 102 may be configured to perform a two phase programming operation for programming the memory array 110 (e.g., a multilevel cell array) by conducting a first phase program flow comprising screening threshold voltage values applied to program respective ones of cells of the array to different levels for correspondence to a respective preliminary verify voltage (PPV') for each level. The preliminary verify voltage (PPV') for at least one level of the cells may be equal to the post program verify voltage of the first program phase (PV') of the at least one level of the cells, and the preliminary verify voltage (PPV') for another level may not be equal to the post program verify voltage of the first program phase (PV') of the other cell. As such, for example, the program/verify operation controller 102 may be configured to screen threshold voltage values applied to program respective ones of Level 3, Level 2 and Level 1 cells of the array for correspondence to a respective preliminary verify voltage (PPV') for each level, and the preliminary verify voltage for Level 3 and Level 2 cells (PPV3' and PPV2') may be equal to the post program verify voltages of the first program phase (PV3' and PV2') of the Level 3 and Level 2 cells, respectively, while the preliminary verify voltage for Level 1 cell (PPV1') is not equal to the post program verify voltage of the first program phase of the Level 1 cell (PV1'). The program/verify operation controller 102 may be configured to thereafter conduct a second phase program flow including programming cells associated with each respective level based on a recorded bit line value learned from the first phase program flow.

In some cases, the program/verify operation controller 102 is further configured to, in response to a determination that the preliminary verify voltage (PPV') for any level is not a passing value, apply programming for a corresponding level for which the preliminary verify voltage (PPV') was not a passing value. In this regard, for example, the program/verify operation controller 102 may be further configured to, in response to applying programming for the corresponding level, determine whether the program verify voltage of the corresponding level is a passing value.

As shown in the example of FIG. 7, the program/verify operation controller 102 may be configured to screen threshold voltage values for each respective level in sequence. In other words, Level 3 may be screened prior to screening Level 2, and Level 2 may be screened prior to screening Level 1 (e.g., in reverse order of magnitude of voltage values employed for the programming). In an exemplary embodiment, the program/verify operation controller 102 may be configured to screen the threshold voltage values by determining that the preliminary verify voltage for Level 1 cell (PPV1') is less than the post program verify voltages of the first program phase of the Level 1 cell (PV1').

In an exemplary embodiment, the operation of the program/verify operation controller 102 may be controlled by the execution by a processor of instructions stored in memory. However, in some embodiments, the program/verify operation controller 102 may itself be an ASIC or FPGA configured to perform the operations described above. As such, for example, a method of programming a plurality of memory cells in a memory device may include verifying a first memory cell targeted to a first level with a first preliminary voltage of a first program phase (PPV1'), programming the first memory cell targeted to the first level in the first program phase, and verifying the first memory cell with a first post program-verify voltage of the first program phase (PV1') in which the first post program-verify voltage is different from the first preliminary voltage.

In an exemplary embodiment, the method may further include programming the first memory cell targeted to the first level in a second program phase and verifying the first memory cell targeted to the first level with a first post program-verify voltage of the second program phase (PV1). In some cases, before verifying the first memory cell, the method may include verifying a second memory cell targeted to a second level with a second preliminary voltage of the first program phase (PPV2'), programming the second memory cell targeted to the second level in the first program phase, and verifying the second memory cell with a second post program-verify voltage of the first program phase (PV2'). Furthermore, in some embodiments, the method may include, before verifying the second memory cell, verifying a third memory cell targeted to a third level with a third preliminary voltage of the first program phase (PPV3'), programming the third memory cell targeted to the third level in the first program phase, and verifying the third memory cell with a third post program-verify voltage of the first program phase (PV3'). An apparatus for performing the method above may include a memory array having a plurality of memory cells and a controller configured to program and verify the memory cells by performing the method described above.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method of programming a memory device comprising a plurality of memory cells, comprising steps of:
   verifying a first memory cell targeted to a first level with a first preliminary voltage of a first program phase;
   programming the first memory cell targeted to the first level in the first program phase in response to verification of the first preliminary voltage not passing;
   verifying the first memory cell with a first post program-verify voltage of the first program phase, wherein the first post program-verify voltage is different from the first preliminary voltage;
   programming the first memory cell targeted to the first level in a second program phase; and
   verifying the first memory cell targeted to the first level with a first post program-verify voltage of the second program phase, wherein the first post program-verify voltage of the second program phase is different from the first post program-verify voltage of the first program phase.

2. The method of claim 1, wherein, before verifying the first memory cell, the method further comprises:
   verifying a second memory cell targeted to a second level with a second preliminary voltage of the first program phase;
   programming the second memory cell targeted to the second level in the first program phase; and
   verifying the second memory cell with a second post program-verify voltage of the first program phase.

3. The method of claim 2, wherein, before verifying the second memory cell, the method further comprises:
   verifying a third memory cell targeted to a third level with a third preliminary voltage of the first program phase;
   programming the third memory cell targeted to the third level in the first program phase; and
   verifying the third memory cell with a third post program-verify voltage of the first program phase.

4. A memory device, comprising:
   a memory array having a plurality of memory cells; and
   a controller for programming and verifying the memory cells, wherein the controller executes verifying a first memory cell targeted to a first level with a first preliminary voltage of a first program phase and programming the first memory cell targeted to the first level in the first program phase in response to verification of the first preliminary voltage not passing, then verifying the first memory cell with a first post program-verify voltage of the first program phase, wherein the first post program-verify voltage is different from the first preliminary voltage, and
   wherein the controller is further configured to:
   program the first memory cell targeted to the first level in a second program phase; and
   verify the first memory cell targeted to the first level with a first post program-verify voltage of the second program phase, wherein the first post program-verify voltage of the second program phase is different from the first post program-verify voltage of the first program phase.

5. The memory device of claim 4, wherein the controller is further configured, before verifying the first memory cell, to:
   verify a second memory cell targeted to a second level with a second preliminary voltage of the first program phase;
   program the second memory cell targeted to the second level in the first program phase; and
   verify the second memory cell with a second post program-verify voltage of the first program phase.

6. The memory device of claim 5, wherein the controller is further configured, before verifying the second memory cell, to:
   verify a third memory cell targeted to a third level with a third preliminary voltage of the first program phase;
   program the third memory cell targeted to the third level in the first program phase; and
   verify the third memory cell with a third post program-verify voltage of the first program phase.

* * * * *